(12) United States Patent
Takehara et al.

(10) Patent No.: US 8,410,950 B2
(45) Date of Patent: Apr. 2, 2013

(54) PHOTOVOLTAIC PANEL MONITORING APPARATUS

(75) Inventors: Toru Takehara, Foster City, CA (US);
Shinichi Takada, Fremont, CA (US)

(73) Assignee: Paceco Corp., Hayward, CA (US)

( * ) Notice: Subject to any disclaimer, the term of this patent is extended or adjusted under 35 U.S.C. 154(b) by 867 days.

(21) Appl. No.: 12/542,524

(22) Filed: Aug. 17, 2009

(65) Prior Publication Data

US 2011/0037600 A1  Feb. 17, 2011

(51) Int. Cl.
  *G08B 21/00*  (2006.01)
(52) U.S. Cl. .................. 340/635; 340/657; 136/244
(58) Field of Classification Search .................. 340/635, 340/644, 3.43, 514, 657; 307/71, 77; 136/251, 136/244, 291, 293; 702/88; 320/101, 162; 700/295
See application file for complete search history.

(56) References Cited

U.S. PATENT DOCUMENTS

| 4,888,702 | A | * | 12/1989 | Gerken et al. | 700/295 |
| 6,720,872 | B1 | * | 4/2004 | Engel et al. | 340/514 |
| 2006/0005876 | A1 | * | 1/2006 | Gaudiana et al. | 136/251 |
| 2006/0162772 | A1 | * | 7/2006 | Presher et al. | 136/290 |
| 2010/0043869 | A1 | * | 2/2010 | Bennett et al. | 136/251 |

* cited by examiner

*Primary Examiner* — Anh V La
(74) *Attorney, Agent, or Firm* — GSS Law Group (57) ABSTRACT

A photovoltaic (PV) panel monitoring apparatus includes a monitoring module for measuring parameter values related to PV panel output, comparing measured values against minimum and maximum values saved in the monitoring module, and outputting an alarm signal when a measured value is outside a range defined by the minimum and maximum values. An alarm signal causes a visual indicator to activate and an audible indicator to sound, thereby assisting maintenance personnel in locating a PV panel with an out-of-range parameter value. The monitoring module further includes a PV panel identification memory for saving an identification code for each PV panel in a PV array. The identification code is transmitted with time, date, and parameter data when the monitoring module detects an out-of-range parameter value. Data may optionally be transmitted from the monitoring module through a communications input/output port or through a wireless transmitter to an external monitoring and control system.

19 Claims, 6 Drawing Sheets

PHOTOVOLTAIC PANEL MONITORING APPARATUS

FIELD OF THE INVENTION

The disclosed embodiments relate to an apparatus for monitoring operation of a photovoltaic panel and for identifying a photovoltaic panel in a photovoltaic array.

BACKGROUND

A photovoltaic array for converting solar energy to electrical power may include several hundred photovoltaic (PV) panels mounted on the roof of a building or a mechanical support structure located close to local electrical loads. On a much larger scale, a PV array operated by an electric power utility may include more than one hundred thousand PV panels electrically interconnected in large groups on tens of thousands of square feet (thousands of square meters) of land area. It is well known that a reduction in output power from a small number of PV panels in a PV array may substantially reduce output power from the entire array. Output power from a PV panel may be reduced by, for example, a shadow falling across part of the PV panel's photosensitive surface, high temperature in part of the PV panel, aging effects, or dust, water, or debris accumulating on the PV panel. Power output may also be reduced by mechanical damage to the relatively brittle silicon material commonly used in the manufacture of commercially available PV panels. Corrosion in electrical connectors and conductors used to interconnect PV panels is also known to reduce PV array output power.

Power output from a PV array may be monitored to determine if PV panels within the array have malfunctioned or are otherwise operating with reduced power output. When an unexpected reduction in PV array output power is detected, it is desirable to determine which PV panel or panels are causing the power reduction. However, since the outputs of many PV panels are combined together in a PV array, it may be difficult to determine which panel or panels are related to an observed reduction in PV array output power.

The time and effort needed to locate a damaged or poorly performing PV panel increases as the number of PV panels in a PV array increases. Troubleshooting a PV array also becomes more difficult and expensive when access to individual PV panels is limited, for example PV panels mounted on top of tall structures or PV panels spaced close together in a large PV array. Furthermore, there are safety hazards associated with placing personnel in proximity to an operating PV array, for example hazards from high voltage, high current, intense direct and reflected sunlight, injuries from falls or from lifting heaving objects, and so on. Because of these hazards, a PV array may be shut down to permit inspections to be conducted in a safe manner. Or, a PV array may be operated with reduced power output until inspections and repairs can be conducted at night. Consequences of shutting down a PV array or operating a PV array at reduced power include, for example, loss of revenue from the sale of electricity, inadequate power available to operate electrical loads, and insufficient voltage output from the array for supplying power to an electrical grid.

What is needed is a simple, reliable, cost-effective system for monitoring the operating status of PV panels in a PV array and for sending information on PV panel status to a central monitoring and control system. What is further needed is a system for identifying and locating a particular PV panel having values of selected operating parameters outside a range for each parameter, so that damaged or degraded PV panels may be quickly located and repaired or replaced.

SUMMARY

Embodiments of an apparatus for monitoring a photovoltaic panel include a monitoring module for measuring parameters related to the operation of the PV panel. The monitoring module compares measured parameter values against corresponding ranges of values and sends an alarm signal when a measured parameter value is outside a selected range. Some embodiments include a monitoring module adapted for removable mechanical and electrical attachment to a PV panel that has already been installed in a PV array. Other embodiments include an assembly comprising a monitoring module and an optional PV panel.

A module controller in the monitoring module outputs an error code and an alarm signal when a measured parameter value is outside a selected range. The alarm signal from the module controller is conditioned by a sensor/indicator input/output circuit and is output by an alarm indicator such as a visual indicator or an audible indicator, by a wireless transmitter, by a communications input/output port, or optionally by a combination of these devices. The alarm indicators optionally produce output in flashing light patterns, human-readable alphanumeric characters, or modulated sound patterns related to a parameter condition detected by the monitoring module. The alarm indicators assist service personnel in locating a PV panel having an out-of-range parameter value and optionally display information related to PV panel status, such as a fault condition. Alarm indicators are particularly advantageous when the PV panel is part of a large PV array. A signal transmitted by the wireless transmitter and other signals optionally output from the communications port include data for identification of the PV panel and optionally includes saved PV panel parameter values retrieved from a data and program memory in the monitoring module.

The monitoring module and alarm indicators receive electrical power from the PV panel being monitored. The monitoring module includes a power management circuit for converting power output from the PV panel to power having voltage and current for operating the monitoring module, wireless transmitter, sensors, and alarm indicators. The power management circuit includes a backup battery for operating the monitoring module and attached devices when output power from the PV panel is reduced or unavailable.

The sensor/indicator input/output circuitry adapts signals from sensors for input to the module controller and signals from the module controller for output to alarm indicators. A clock/calendar module in the monitoring module outputs data for labeling the time and date of data collected from a PV panel, and a PV panel identification memory retains a unique identification code assigned to the PV panel. The module controller, clock/calendar module, panel identification memory, and data and program memory may optionally be operated to create, save, and output a table of time-stamped values and error codes related to an operating history of the PV panel being monitored.

In some embodiments, a module controller is part of a node controller, for example a node controller as disclosed in U.S. patent application Ser. No. 12/243,890, titled "Network Topology For Monitoring and Controlling a Solar Panel Array", incorporated herein by reference in its entirety, as further disclosed in U.S. patent application Ser. No. 12/352,510, titled "System For Controlling Power From A Photovoltaic Array By Selectively Configuring Connections Between Photovoltaic Panels", incorporated herein by reference in its entirety, and also as disclosed in U.S. patent application Ser. No. 12/389,337, titled "Method For Reconfigurably Connecting Photovoltaic Panels In A Photovoltaic Array", incorporated herein by reference in its entirety. A node controller may optionally be part of an intelligent node. Descriptions of an intelligent node are given in the applications listed above.

This section summarizes some features of the present invention. These and other features, aspects, and advantages of the invention will become better understood with regard to the following description and upon reference to the following drawings, wherein:

DESCRIPTION

An apparatus for monitoring parameters related to operation and status of a PV panel selectively outputs electrical, light, and sound signals related to values of monitored parameters. Embodiment of the apparatus may optionally output signals for identification of a PV panel having a parameter value outside a related range of values. The embodiments disclosed herein are advantageous for monitoring and reporting performance of individual PV panels in a PV array and for identifying and locating specific PV panels related to a reduction in output power from the PV array.

An embodiment includes a monitoring module and may optionally include at least one PV panel electrically and mechanically connected to the monitoring module. In some embodiments, the monitoring module and PV panel are part of an intelligent node. Optionally, a node controller is part of the monitoring module. In some embodiments, the node controller is part of an intelligent node. The monitoring module and PV panel may optionally be supplied as an integral unit. Alternately, a separate monitoring module is adapted for removable mechanical and electrical connection to a PV panel, for example a PV panel that is already part of a PV array. Some embodiments include a beacon antenna for wireless exchange of signals with an external monitoring and control system and may optionally include a visual indicator for transmitting visual error and status signals and for identifying and locating a PV panel in a PV array. An optional audible indicator may also be included for emitting error and status sound signals and to assist in locating a particular PV panel. An illumination sensor may optionally be included for detecting an amount of sunlight incident upon a photovoltaic panel.

Figure 1:
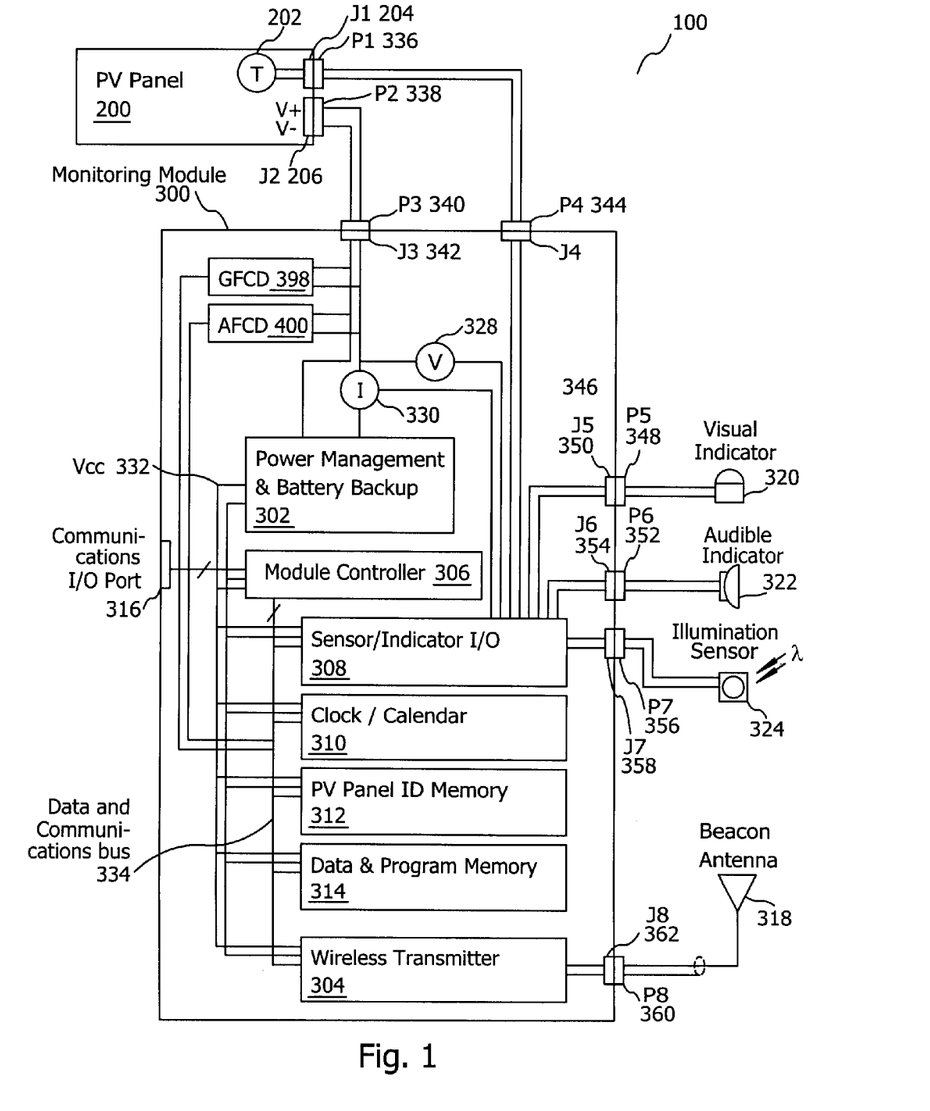
FIG. 1 shows a block diagram of an example of a PV panel monitoring apparatus including an optional PV panel.

An example of an embodiment of a PV panel monitoring apparatus is shown in FIG. 1. FIG. 1 represents a simplified block diagram of an embodiment 100 of a PV panel monitoring apparatus including a monitoring module 300 electrically connected to an optional PV panel 200. The monitoring module 300 measures parameter values related to the status and performance of the PV panel 200 and selectively outputs electrical signals, visual signals, and sound signals to assist operating and maintenance personnel in identifying and locating the particular PV panel from which parameter values were measured.

The monitoring module 300 of FIG. 1 includes a module controller 306 for monitoring parameters from the PV panel 200 and comparing measured parameter values against saved values to determine if the PV panel is malfunctioning or operating inefficiently. The module controller 306 sends and receives digital and optionally analog signals over a plurality of electrical connections comprising a data and communications bus 334. In some embodiments, analog signals are converted to digital signals and digital signals are converted to analog signals by sensor/indicator I/O circuitry 308. Alternatively, some signal conversion is accomplished within the module controller 306. The module controller 306 is adapted for communicating parameter values with an external system such as a monitoring and control system or a portable data collection system and for outputting signals for identification of the PV panel being monitored by the monitoring module 300. Electrical signals are selectively exchanged between the module controller 306 in the monitoring module 300 and an external system through a communications I/O port 316. The monitoring module 300 may optionally operate autonomously or may measure, save, and report parameter values after receiving commands from an external system.

Figure 3:
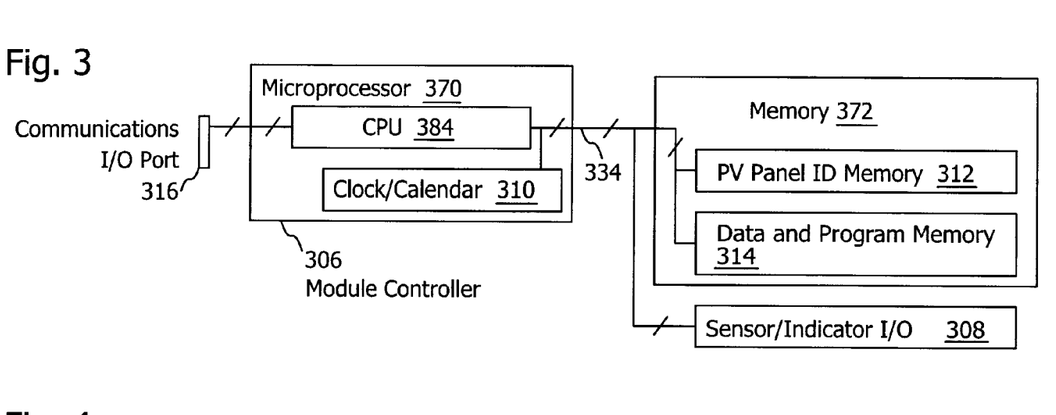
FIG. 3 shows a block diagram of an example of a module controller.

A module controller 306 may alternatively be implemented using discrete logic, a microprocessor, or a microcontroller, or as a customizable logic device such as an application specific integrated circuit (ASIC), a programmable logic device (PLD), a gate array, or a combination of these devices, and optionally includes a combination of digital and analog circuits. An example of a module controller 306 having a microprocessor is shown in FIG. 3. In FIG. 3, a module controller 306 comprises a microprocessor 370 having a central processing unit (CPU) 384 and a clock/calendar circuit 310. The CPU 384 sends and receives data and commands through a plurality of lines connected to the communications I/O port 316 on the monitoring module. The CPU 384 obtains time and date information from the clock/calendar 310, which may alternatively be implemented as a circuit in the microprocessor 370, as a peripheral electrical circuit, for example a peripheral integrated circuit, or as software executing on the CPU 384. The microprocessor 370 communicates with the sensor/indicator I/O circuit 308 and one or more memory devices 372 over a plurality of lines comprising the data and communications bus 334. The memory device may optionally include a PV panel ID memory 312 and a data and program memory 314. Alternately, the PV panel ID memory 312 and the data and program memory 314 may be located in separate memory devices 372.

Figure 4:
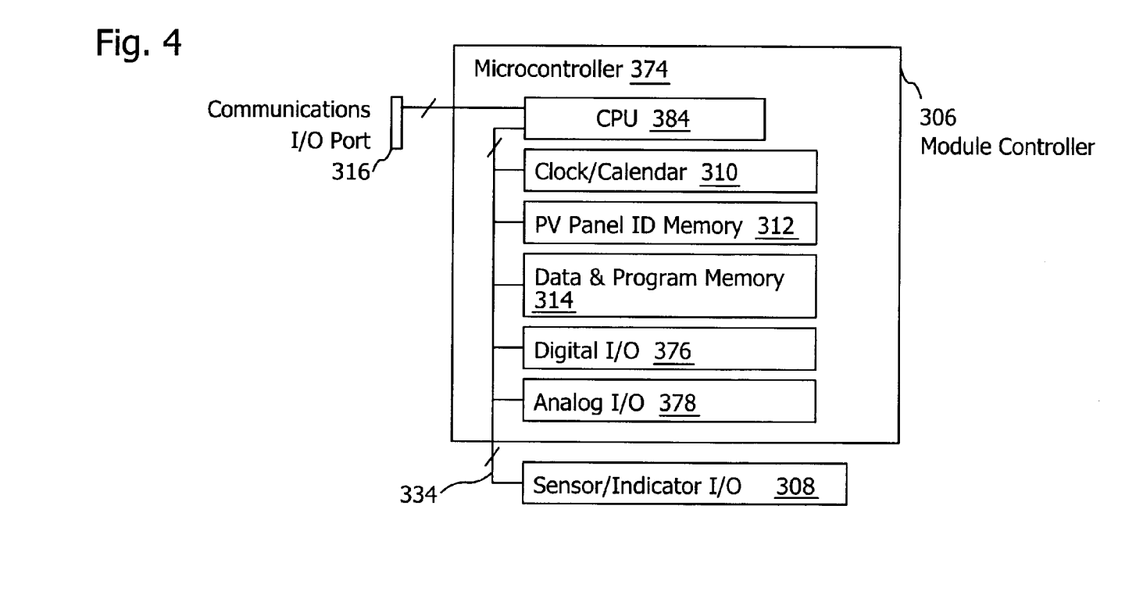
FIG. 4 is a block diagram of an alternative implementation of a module controller.

An example of a module controller 306 having a microcontroller is shown in FIG. 4. In FIG. 4, a module controller 306 comprises a microcontroller 374 having a CPU 384, a clock/calendar 310, a PV panel ID memory 312, a data and program memory 314, digital I/O 376 for exchanging digital signals with the sensor/indicator I/O circuit 308 over the data and communications bus 334, and analog I/O 378 for exchanging analog signals with the sensor/indicator I/O circuit 308. Optionally, an external memory device may be connected to the microcontroller 374 to increase memory capacity, for example by connecting a memory device 372 as shown in the example of FIG. 3.

Figure 5:
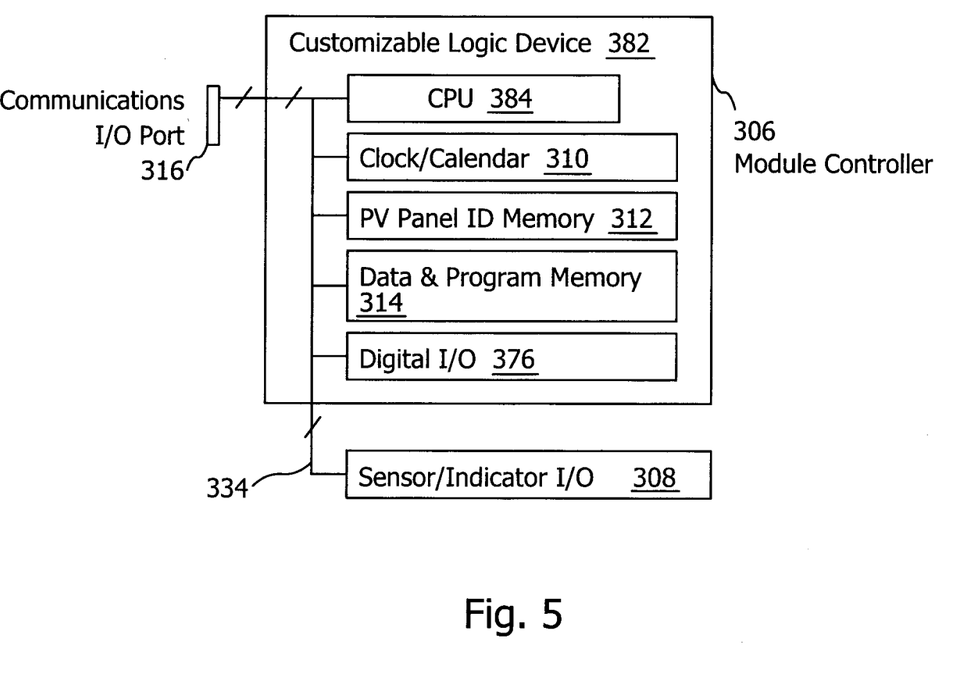
FIG. 5 is a block diagram of another alternative implementation of a module controller.

An example of a module controller 306 implemented as a customizable logic device is shown in FIG. 5. In the example embodiment of FIG. 5, the customizable logic device 382 includes a CPU 384 electrically connected to a data and communications bus 334, a clock/calendar 310, a PV panel ID memory 312, a data and program memory 314, and digital I/O circuitry 376. In some embodiments, analog I/O functions, for example an analog to digital converter, a digital to analog converter, a high-current output driver, and a high-voltage output driver, are part of the sensor/indicator I/O circuit 308. In other embodiments, some or all of these analog functions are included in the customizable logic device.

As shown in FIGS. 1-5, the module controller 306 is electrically connected to a communications input/output (I/O) port 316. Signals representative of PV panel parameter values may optionally be output by the module controller 306 on the communications I/O port 316. Signals representative of commands to be performed by the module controller 306 may optionally be received from an external monitoring and control system on the communications I/O port 316. Such commands may be related to, but are not limited to, output of an identification code for the PV panel, output of time-and date-stamped parameter values for the PV panel, and error codes related to PV panel status. Data and commands exchanged between the monitoring module 300 and an external monitoring and control system via the communications I/O port 316 pass over an external communications system, for example a communications system using electrical conductors, fiber optics, or power line communications (PLC).

Figure 6:
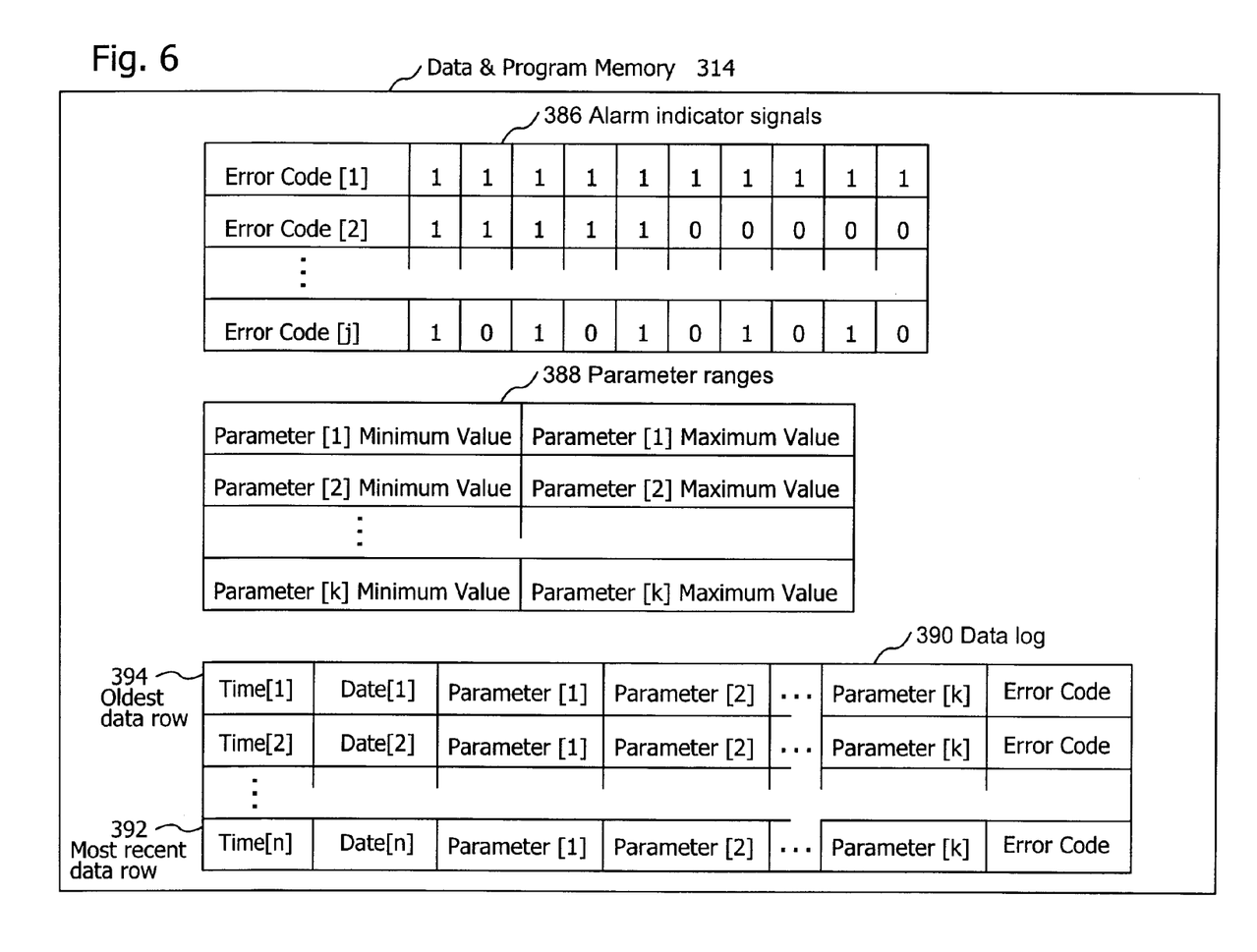
FIG. 6 shows an example of data values and parameter names representative of data values saved in arrays in a data and program memory.

The data and program memory 314 is adapted for storage and retrieval by the module controller 306 of commands received through the communications I/O port 316 and digital data values output from the sensor/indicator I/O circuit 308, the PV panel ID memory 312, and the clock/calendar 310. Data saved in the data and program memory may be organized in many alternative logical structures. An example of a logical structure for storing data related to PV panel status and performance is shown in FIG. 6. As shown in FIG. 6, a data and program memory 314 is organized into memory areas corresponding to three data tables. A data table for alarm indicator signals 386 holds values related to error codes, each error code corresponding to a different detectable error condition in a PV panel, and a row of data values representing a visible or audible error signal to be output from an alarm indicator. Each data value optionally represents an "on" state or an "off" state of an alarm indicator for a predetermined length of time. For example, a pattern of visible flashes or audible sounds may indicate no output voltage from the PV panel. A different pattern may indicate a PV panel temperature that is too high. One will appreciate that an embodiment may optionally be configured to selectively generate many different light patterns and sound patterns related to operating and status conditions of the PV panel 200 and monitoring module 300.

In the example shown in FIG. 6, Error Code [1] is an alarm indicator signal that is "on" for all ten time periods, Error Code [2] is on for five time periods and off for five time periods, and Error Code [j] alternates between on and off from one time period to the next. One will appreciate that many other signal coding alternatives are within the scope of the embodiments described herein. For example, a data value associated with each error code optionally represents a programming parameter for specifying a sound pattern from an alarm indicator having a programmable tone generator. Data values representative of data to be displayed on an alphanumeric display may optionally be stored in the data table for alarm indicator signals. Data values may be represented in binary format as shown in FIG. 6, or in hexadecimal, ASCII, or other numerical formats.

The data and program memory 314 in the example of FIG. 6 includes a table of parameter ranges 388. Each row in the table of parameter ranges 388 represents limiting values for a parameter to be monitored, such as voltage, temperature, incident illumination, and so on. Each row comprises at least two values, a minimum value for a parameter and a maximum value for the parameter. For example, the row for parameter [1] in the parameter range table 388 may represent minimum and maximum values for PV panel output voltage, the row for parameter [2] may represent minimum and maximum values for PV panel output current, and so on.

A third data table in the data and program memory 314 of FIG. 6 represents an example of a data log 390. In the example of FIG. 6, the most recent data row 392 is at the bottom of the table and the oldest data row 394, that is, the first entry in the data log, is at the top. A row in the data log 390 saves the values of parameter 1, parameter 2, and so on up to parameter k, at a selected time and date represented by the time and date values at the beginning of the row. At a next selected time and date, another row is added to the table. The row added at the next selected time and date includes the time, date, and values for parameters [1] to [k]. An entry may optionally be made in the data log 390 at regular time intervals. Alternately, an entry may be made in the data log 390 upon detection of an error condition, and an error code and parameters related to the error condition are stored into the data log 390. Other stack structures or data table formats generally known by one skilled in the art may also be used.

Time and data values for the data log 390 of FIG. 6 may optionally be obtained from the clock/calendar circuit 310 by the module controller 306 of FIGS. 1-5. The module controller 306 selectively associates time and date values with one or more measured parameter values and saves the time, date, and parameter values in the data and program memory 314 to form a historical log of PV panel performance. A historical log may optionally include a time and date at which the module controller 310 detects a parameter value from the PV panel 200 that is outside a range of values retrieved from the data and program memory 314. Limiting values related to a PV parameter range may optionally be received by the monitoring module 300 through the communications I/O port 316 and saved in the data and program memory 314. Limiting values for parameter ranges may optionally be modified by the module controller 306 in response to, for example, measured values of temperature or incident illumination.

The PV panel ID memory 312 in FIGS. 1-5 retains an identification code assigned to each PV panel 200 in a PV array. The identification code may be saved in the monitoring module 300 at the time the monitoring module 300 is installed on a PV panel. Alternatively, an identification code may be received from an external system through the communications I/O port 316 and stored in the PV panel ID memory 312 by the module controller 306. In some embodiments, the PV panel ID memory is nonvolatile memory which may optionally be reprogrammable or may alternately be programmable once. In other embodiments, an identification code is retained in the PV panel ID memory 312 as long as the memory 312 receives power from a PV panel 200 or from a battery in the monitoring module 300.

As shown in FIG. 1, the module controller 306 exchanges signals with alarm indicators and sensors through a sensor/indicator I/O circuit 308. In some embodiments, the sensor/indicator I/O circuit modifies output signals from the module controller 306 so the signals have sufficient voltage and current to drive a visual indicator 320. Other signals from the module controller 306 are modified so the signals are able to drive an audible indicator 322. Sensor output signals related to PV panel parameters are also conditioned by the sensor/indicator I/O circuit before being input to the module controller 306. For example, an optional illumination sensor 324 measures an amount of light incident upon the solar panel 200. The signal from the illumination sensor 324 is converted to a digital value for input to the module controller 306 and is saved by the module controller 306 in the data and programming memory 314. Alternately, an output signal from the illumination sensor 324 is converted to a corresponding digital value within the module controller 306. Electrical signals from the illumination sensor 324 are coupled into the sensor/indicator I/O circuit 308 through an optional cable connector P7 356 and through a corresponding optional connector 37 358 on the monitoring module 300.

Output voltages V+ and V− from the PV panel 200 are output on an electrical connector J2 206, as shown in FIG. 1. Cable connector P2 338 connects to J2 206 and carries voltages V+ and V− to cable connector P3 340, which attaches to power input connector J3 342 on the monitoring module 300. Alternatively, electrical connections to and from the monitoring module may be made with point-to-point wiring instead of with electrical connectors, for example point-to-point wiring electrically connected to terminal strips. A value of PV panel 200 output current is measured by an optional current sensor 330 in series with a power connection between J3 342 and a Power Management and Battery Backup circuit 302. An output signal from the current sensor 330 is input to the sensor/indicator I/O circuit 308, converted to a form suitable for input to the module controller 306, and a corresponding numerical value of PV panel output current is selectively stored in the data and program memory 314. Similarly, a value of PV panel 200 output voltage is measured by a voltage sensor 328 electrically connected to the power input connector J3 342 and sensor/indicator I/O circuit 308, and a PV panel output voltage value is selectively saved in the data and program memory 314. The module controller 306 may then compare measured values of current and voltage from the PV panel 200 against, for example previously saved values, or against a range of values related to an amount of illumination measured by the illumination sensor 324 to determine if the PV panel is operating efficiently or if it is producing a smaller amount of output power than expected.

A PV panel 200 may optionally include one or more temperature sensors 202. Signals related to temperatures on the PV panel 200 are output from a connector J1 204 on the PV panel 200, coupled to cable connector P1 336 and then to cable connector P4 344 which is connected to connector J4 346 on the monitoring module 300. Output signals from the temperature sensor 202 pass through lines from connector J4 346 to inputs to the sensor/indicator I/O circuit 308. Values for measured temperatures on the PV panel 200 are selectively saved in the data and program memory 314 for subsequent comparison by the module controller 306 against a range of operating temperatures for normal operation of the PV panel. A measured temperature may also be used by the module controller 306 to modify expected values of other parameters, for example a value of output current expected at a particular temperature. A measured temperature outside a range of operating temperatures is detected by the module controller 306, which sends a signal representing an alarm condition to the communications I/O port 316 and the sensor/indicator I/O circuit 308.

Figure 2:
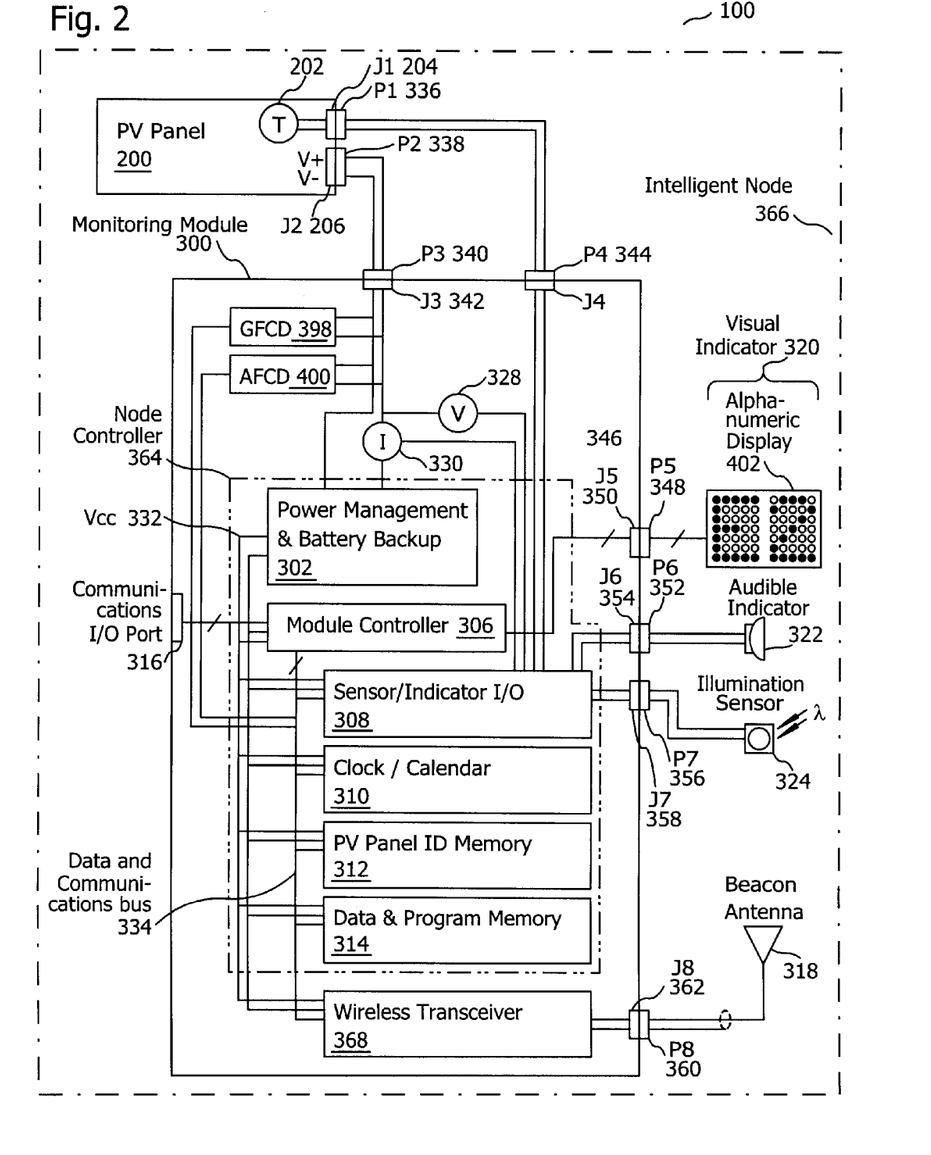
FIG. 2 shows a block diagram of an example of a PV panel monitoring system including an intelligent node and a node controller.

A signal representing an alarm condition causes activation of one or more alarm indicators such as a visual indicator 320 or an audible indicator 322. In some embodiments, for example the embodiment shown in FIG. 1, the visual indicator 320 comprises one or more incandescent bulbs or light-emitting diodes (LEDs) capable of being collectively turned on and off in response to a signal output from the sensor/indicator input/output circuit 308 under the control of the module controller 306. In other embodiments, the visual indicator 320 comprises an alphanumeric display adapted to show an error code, a panel identification number, or other selected alphanumeric values. An example of a visual indicator 320 comprising an alphanumeric display 402 is shown in FIG. 2. In the example of FIG. 2, the alphanumeric display 402 displays an error code "E2", although one will appreciate that other letters and numbers could also be displayed. In the example of FIG. 2, the alphanumeric display 402 receives input signals representative of data to be displayed from the module controller 306. In other embodiments, the alphanumeric display receives input signals from the sensor/indicator I/O circuit 308. The alphanumeric display 402 in FIG. 2 may alternatively be implemented as an LED display, a vacuum fluorescent display, a liquid crystal display, an electromechanical display, or other types of display capable of showing characters which may be read in daylight or at night by service personnel standing several yards (meters) away from the PV panel 200. Although the example of FIG. 2 shows an alphanumeric display for two characters, a display for showing more than two characters may be used.

Signals from the sensor/indicator I/O circuit 308 to the visual indicator 320 are optionally coupled through connector J5 350 on the monitoring module 300 and cable connector P5 348 electrically connected to the visual indicator 320, as shown in FIG. 1. Signals from the sensor/indicator I/O circuit 308 to the audible indicator 322 are optionally coupled through connector J6 354 on the monitoring module 300 and cable connector P6 352 electrically connected to the audible indicator 322.

The visual indicator 320 and the audible indicator 322 are provided to assist service personnel in locating a PV panel having an out of range temperature condition as determined by the module controller 320. Furthermore, the module controller 306 may optionally output an alarm signal for a current sensor 330 output signal or a voltage sensor 328 output signal outside a range expected for a measured amount of incident illumination. For example, a PV panel exposed to sunlight but having no output current may cause an alarm signal to be output by the module controller 306. The module controller may optionally suppress the output of some alarm signals when the illumination sensor senses that the panel is receiving too little illumination to output usable electric power. Sounds produced by the audible indicator 322 and lights emitted from the visual indicator 320 may optionally be output in selected on-off patterns for conveying information to a person seeing or hearing the alarm indicator. Data related to selected patterns and associated error conditions are stored in the data and program memory 314 and retrieved by the module controller 306, as previously explained for FIG. 6.

A monitoring module 300 optionally includes a wireless transmitter 304 electrically connected to the module controller 306 over the data and communications bus 334, as shown in FIG. 1. The wireless transmitter 304 selectively transmits radio frequency signals related to data from the module controller 306 and data and program memory 314 over a beacon antenna 318. Electrical signals between the beacon antenna 318 and the wireless transmitter 304 pass through an optional cable connector P8 360 and a corresponding connector J8 362 on the monitoring module 300. Alternately, the wireless transmitter 304 is replaced with a wireless transceiver adapted for sending and receiving radio frequency signals. An example of a monitoring module 300 including a wireless transceiver 368 is shown in FIG. 2.

Data sent from the module controller 306 to the wireless transmitter 304, or alternately to the transceiver 368, optionally includes, but is not limited to, a PV panel identification code, a time value, a data value, values for PV panel temperature, output current, and output voltage, a value for incident illumination, and data related to operational status of the monitoring module 300, for example, but not limited to, charge status of a battery in the power management and battery backup circuit 302. One will appreciate that many other data items related to PV panel condition may optionally be sent by the module controller 306 to the wireless transmitter 304 for radio transmission to an external system. In some embodiments, the wireless transmitter 304 or the transceiver 368 conforms to a communication protocol for relatively long range communications. In other embodiments, the wireless transmitter 304 or the transceiver 368 conforms to a communications protocol for relatively short range communications, such as Bluetooth (IEEE 802.11) or similar standards for sending information to portable devices separated by a few meters from the monitoring module. Such a portable device may be carried by service personnel or carried in a vehicle for rapidly scanning output transmissions from a large number PV panels in a PV array.

Referring again to FIG. 1, power to operate the monitoring module 300, optional sensors, and optional alarm indicators is supplied by the PV panel 200. Output current and output voltage from the PV panel 200 are input to the power management and battery backup circuit 302. The power management and battery backup circuit 302 distributes the current and voltage received from the PV panel 200 on a power bus Vcc 332 to other parts of the PV panel monitoring apparatus 100. Optionally, the power management and battery backup circuit 302 outputs a voltage Vcc having a different value than the value of voltage output from the PV panel 200. The power management and battery backup circuit 302 includes a backup battery and circuitry for charging the battery so that the monitoring module 300 may continue to operate when the PV panel is not producing sufficient output power, for example at night or when a shadow falls across the PV panel.

Some embodiments of a monitoring module 300 include circuits for detecting a ground fault. A Ground Fault Circuit Detector (GFCD) 398 in FIG. 1 and FIG. 2 is electrically connected in parallel with V+ and V− lines from the output of the PV panel 200 to the inputs of the power management and battery backup circuit 302. In order to reduce the risk of fire from an electrical short circuit or an electrical arc in the PV panel 200 or monitoring module 300, some embodiments include an arc fault circuit detector (AFCD) 400, also electrically connected in parallel with V+ and V− lines from the output of the PV panel 200 to the inputs of the power management and battery backup circuit 302. An output from the GFCD 398 and an output from the AFCD 400 are electrically connected to the data and communications bus 334. Alternately, outputs from the GFCD 398 and AFCD 400 are electrically connected directly to inputs on the module controller 306, for example interrupt inputs. Upon receiving a signal from the GFCD 398 or the AFCD 400, the module controller 306 may selectively shut down parts of the monitoring module 300, cause the PV panel 200 to be electrically bypassed or electrically disconnected from the PV array in which the PV panel resides. The monitoring module 300 optionally outputs audible or visual alarm signals to warn service personnel about ground fault or arc fault hazards.

In some embodiments, a PV panel monitoring apparatus includes an intelligent node. FIG. 2 illustrates a PV panel monitoring apparatus 100 comprising an intelligent node 366. In some embodiments, a monitoring module includes a node controller 364. The node controller 364 optionally includes a power management and battery backup circuit 302, a module controller 306, a sensor/indicator I/O circuit 308, a clock/calendar circuit 310, a PV panel ID memory 312, and a data and program memory 314, or any subset combination of these circuit elements. An example of a node controller 364 in a monitoring module 300 appears in FIG. 2. An intelligent node 366 and a node controller 364 may optionally be used together in an embodiment, as shown in FIG. 2.

Figure 7:
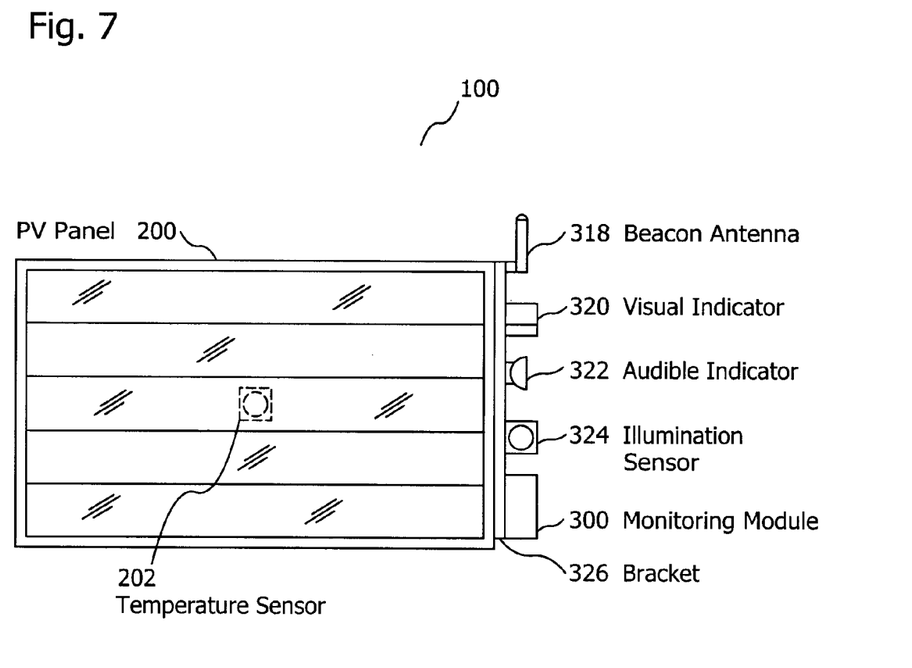
FIG. 7 shows a front view of the example of a PV panel monitoring apparatus of FIG. 1.

A front view of an embodiment 100 comprising a monitoring module mechanically attached to a PV panel is shown in FIG. 7. One or more optional temperature sensors 202 are attached to the PV panel 200 to measure PV panel operating temperatures. In the example of FIG. 7, a temperature sensor 202 is attached to a back surface of the photosensitive area of the PV panel 200. In some embodiments, a monitoring module 300, illumination sensor 324, audible indicator 322, visual indicator 320, and beacon antenna 318 are mechanically attached to a bracket 326. An illumination sensor 324 may optionally be attached to a front surface of the PV panel 200, preferably in a location which does not reduce sunlight exposure of a solar cell in the PV panel. The bracket 326 provides structural support for the monitoring module, sensors, and indicators, and further provides a standardized mechanical interface for attachment to PV panels in a PV array. Although the example of FIG. 2 shows the bracket 326 attached to a right side of the PV panel 200, one will appreciate that alternative embodiments may have a bracket attached to one of the other sides of the PV panel, to a back surface of the panel, or to a support structure for holding a PV panel. Other alternative embodiments have the beacon antenna 318, visual indicator 320, and other components arranged in a different order on the bracket 326. Yet other embodiments omit some optional components.

Unless expressly stated otherwise herein, ordinary terms have their corresponding ordinary meanings within the respective contexts of their presentations, and ordinary terms of art have their corresponding regular meanings.

What is claimed is:
1. An apparatus comprising:
a monitoring module adapted for electrical connection to a photovoltaic panel for monitoring the photovoltaic panel, comprising:
a power management and battery backup circuit adapted to receive electrical power from the photovoltaic panel and supply a portion of the electrical power received from the photovoltaic panel to the monitoring module; and
a module controller electrically connected to said power management and battery backup circuit;
a selected group of parameters, comprising:
an identification code for the photovoltaic panel;
an error code output from said module controller;
a photovoltaic panel output voltage; and
a photovoltaic panel output current;
a first communications interface electrically connected to said module controller and adapted to send and receive said selected group of parameters;
a second communications interface electrically connected to said module controller and adapted to send and receive said selected group of parameters;

a sensor adapted to send a signal related to an operating condition of the photovoltaic panel to said monitoring module; and an alarm indicator activated by said monitoring module when a signal received from said sensor is outside a selected range.

2. The apparatus of claim 1, wherein said second communications interface comprises a wireless transmitter electrically connected to said module controller and a beacon antenna electrically connected to said wireless transmitter.

3. The apparatus of claim 1, wherein said monitoring module further comprises a clock/calendar circuit electrically connected to said module controller.

4. The apparatus of claim 1, wherein said monitoring module further comprises a data and program memory electrically connected to said module controller.

5. The apparatus of claim 1, wherein said monitoring module further comprises a photovoltaic panel identification memory electrically connected to said module controller.

6. The apparatus of claim 5, wherein said module controller is adapted to retrieve a value from said photovoltaic panel identification memory and send the value to a wireless transmitter and to a communications port.

7. The apparatus of claim 1, further comprising a sensor/indicator input/output circuit electrically connected to said module controller.

8. The apparatus of claim 7, further comprising a first alarm indicator electrically connected to said sensor/indicator input/output circuit.

9. The apparatus of claim 8, further comprising a second alarm indicator electrically connected to said sensor/indicator input/output circuit.

10. The apparatus of claim 8, wherein said first alarm indicator is a visual indicator.

11. The apparatus of claim 10, wherein said visual indicator comprises an alphanumeric display.

12. The apparatus of claim 9, wherein said second alarm indicator is an audible indicator.

13. The apparatus of claim 1, further comprising a ground fault circuit detector electrically connected in parallel with said power management and battery backup circuit, wherein said module controller causes the photovoltaic panel to be electrically disconnected from a photovoltaic array when said module controller receives a signal from said ground fault circuit detector.

14. The apparatus of claim 1, further comprising an arc fault circuit detector electrically connected in parallel with said power management and battery backup circuit, wherein said module controller causes the photovoltaic panel to be electrically disconnected from a photovoltaic array when said module controller receives a signal from said arc fault circuit detector.

15. The apparatus of claim 1, wherein said sensor is an illumination sensor for detecting an amount of sunlight incident upon a photovoltaic panel.

16. The apparatus of claim 1, wherein said monitoring module further comprises a photovoltaic panel output voltage sensor electrically connected to said sensor/indicator input/output circuit.

17. The apparatus of claim 1, wherein said monitoring module further comprises a photovoltaic panel output current sensor electrically connected to said sensor/indicator input/output circuit.

18. The apparatus of claim 1, further comprising a temperature sensor electrically connected to said sensor/indicator input/output circuit, wherein said temperature sensor is adapted to read an operating temperature of said photovoltaic panel.

19. The apparatus of claim 1, further comprising a photovoltaic panel electrically connected to said monitoring module.

* * * * *